United States Patent
Burberry et al.

(10) Patent No.: US 9,249,504 B2
(45) Date of Patent: Feb. 2, 2016

(54) METHOD OF PASSIVATING ULTRA-THIN AZO WITH NANO-LAYER ALUMINA

(71) Applicants: Mitchell Stewart Burberry, Webster, NY (US); Lee William Tutt, Webster, NY (US)

(72) Inventors: Mitchell Stewart Burberry, Webster, NY (US); Lee William Tutt, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 274 days.

(21) Appl. No.: 14/037,862

(22) Filed: Sep. 26, 2013

(65) Prior Publication Data

US 2015/0086709 A1 Mar. 26, 2015

(51) Int. Cl.
*C23C 16/40* (2006.01)
*C23C 16/06* (2006.01)
*C23C 16/44* (2006.01)

(52) U.S. Cl.
CPC ............... *C23C 16/06* (2013.01); *C23C 16/403* (2013.01); *C23C 16/405* (2013.01); *C23C 16/44* (2013.01)

(58) Field of Classification Search
CPC .... C23C 16/403; C23C 16/407; C23C 16/44; C23C 16/45525
See application file for complete search history.

(56) References Cited

U.S. PATENT DOCUMENTS

| | | | | |
|---|---|---|---|---|
| 2010/0159395 A1* | 6/2010 | Fyson et al. | | 430/302 |
| 2012/0107554 A1* | 5/2012 | Pfaff et al. | | 428/141 |
| 2012/0186648 A1* | 7/2012 | Zang et al. | | 136/256 |
| 2012/0222970 A1* | 9/2012 | Melosh et al. | | 205/698 |
| 2013/0139878 A1* | 6/2013 | Bhatnagar et al. | | 136/256 |
| 2015/0086709 A1* | 3/2015 | Burberry et al. | | 427/124 |

OTHER PUBLICATIONS

Jiang, X., et al., "Aluminum-doped zinc oxide films as transparent conductive electrode for organic light-emitting devices." Applied Physics Letters, vol. 83, No. 9, Sep. 1, 2003, pp. 1875-1877.*

Minami, Tadatsugu, et al., "Highly Conductive and Transparent Aluminum Doped Zinc Oxide Thin Films Prepared by RF Magnetron Sputtering". Japanese Journal of Applied Physics, vol. 23, No. 5, May 1984, pp. L280-L282.*

Kelly, P.J., et al., "A novel technique for the deposition of aluminum-doped zinc oxide films". Thin Solid Films 426 (2003) 111-116.*

Elam, J.W., et al., "Conformal Coating on Ultrahigh-Aspect-Ratio Nanopores of Anodic Alumina by Atomic Layer Deposition". Chem. Mater. 2003, 15, 3507-3517.*

* cited by examiner

*Primary Examiner* — Bret Chen
(74) *Attorney, Agent, or Firm* — Raymond L. Owens

(57) ABSTRACT

A method of making an electrical conductor includes depositing an ultra-thin layer including aluminum-doped zinc oxide layer on a surface and using atomic layer deposition to deposit a nano-layer including alumina in contact and conformal with a surface of the ultra-thin layer including aluminum-doped zinc oxide.

16 Claims, 3 Drawing Sheets

METHOD OF PASSIVATING ULTRA-THIN AZO WITH NANO-LAYER ALUMINA

CROSS REFERENCE TO RELATED APPLICATIONS

Reference is made to commonly-assigned, co-pending U.S. patent application Ser. No. 14/037,831 (now U.S. publication No. 20150083461), filed Sep. 26, 2013, entitled "Ultra-Thin AZO with Nano-Layer Alumina Passivation" by Burberry et al, the disclosure of which is incorporated herein.

FIELD OF THE INVENTION

The present invention relates to transparent electrical conductors and more particularly to transparent conductive oxides.

BACKGROUND OF THE INVENTION

Transparent electrical conductors are widely used in the flat-panel display industry to form electrodes that are used to electrically switch light-emitting or light-transmitting properties of a display pixel, for example, in liquid crystal or organic light-emitting diode displays. Transparent conductive electrodes are also used in touch screens in conjunction with displays.

In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Publication 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent conductive oxides (TCOs) are used in applications where materials are required to conduct electricity and transmit visible light with little absorption and reflection losses. Applications include touch panels, electrodes for LCD, OLEDs, electrochromic and electrophoretic displays, solid-state lighting, solar cells, energy conserving architectural windows, defogging aircraft and automobile windows, heat-reflecting coatings to increase light bulb efficiency, gas sensors, antistatic coatings, and wear resistant layers on glass. ITO is the most commonly used TCO and is typically made by electron beam evaporation or by sputtering. The properties of the ITO electrodes are highly dependent on the deposition conditions which affect the number of oxygen vacancies and carriers in the material as described in "Properties of tin doped indium oxide thin films prepared by magnetron sputtering by Ray Swati, R. Banerjee, N. Basu, A. K. Batabyal, and A. K. Barua in the *Journal of Applied Physics* 54(6), 3497 (1983).

Indium is in high demand and cost is expected to rise. Alternative materials are of great commercial interest including aluminum-doped zinc oxide (AZO), indium-gallium-doped zinc oxide (IGZO) and other examples of doped zinc oxide (ZnO).

Alumina ($Al_2O_3$) passivation has been shown to stabilize the columbic and thermal keeping properties of field effect transistors made with ZnO for example as described in "Passivation of ZnO TFTs" by D. A. Mourey, M. S. Burberry, D. A. Zhao, Y. V. Li, S. F. Nelson, L. Tutt, T. D. Pawlik, D. H. Levy, T. N. Jackson in the *Journal of the Society for Information Display*, vol. 18, issue 10, October 2010. It is well known in the art that relatively thick alumina layers (>100 nm) stabilize AZO films from environmental effects, as described in ALD 2013, 13 International Conference on Atomic Layer Deposition Abstracts, "Spatial ALD of transparent conductive oxides" by A. Illiberi, T. Grehi, A. Sharma, B. Cobb, G. Gelinck, P. Poodt, H. Brongersma and F. Roozeboom, and, 97(2013).

It is also well known that the atomic layer deposition (ALD) process produces high-quality, highly conformal films useful in many applications; however ALD is slower than many other deposition processes and therefore applications using ultra-thin layers (<50 nm) are of great practical interest.

SUMMARY OF THE INVENTION

There is a need, therefore, for further improvements in transparent conductors and methods for making transparent conductive oxide electrodes.

In accordance with the present invention, a method of making an electrical conductor comprises:
depositing an ultra-thin layer including aluminum-doped zinc oxide on a surface; and
using atomic layer deposition to deposit a nano-layer including alumina in contact and conformal with a surface of the ultra-thin layer including aluminum-doped zinc oxide.

The present invention provides a thin-film transparent electrical conductor with improved electrical conductivity and decreased contact resistance.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

Figure 1:
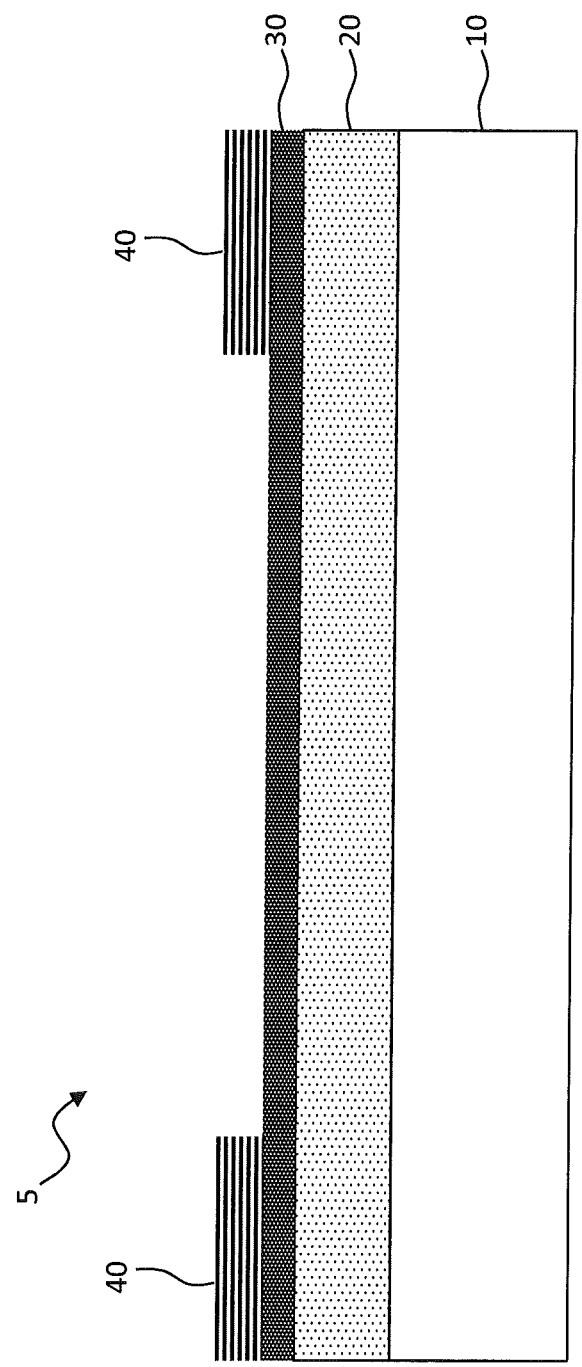
FIG. 1 is a cross section of an embodiment of the present invention.

Referring to FIG. 1, a cross sectional representation of an embodiment of the present invention is shown. An electrical conductor 5 includes an ultra-thin layer including aluminum-doped zinc-oxide 20 formed on a surface of a substrate 10. A nano-layer including alumina 30 is in contact and conformal with a surface of the ultra-thin layer including aluminum-doped zinc oxide 20. In a further embodiment of the present invention, an electrical contact 40 is in electrical communication with the ultra-thin layer including aluminum-doped zinc oxide 20 through the nano-layer including alumina 30.

In other embodiments of the present invention, the ultra-thin layer including aluminum-doped zinc-oxide 20 is an ultra-thin layer of aluminum-doped zinc-oxide or the nano-layer including alumina 30 is a nano-layer of alumina. The ultra-thin layer including aluminum-doped zinc-oxide 20 is also referred to herein as the ultra-thin layer, the ultra-thin AZO layer 20, or the ultra-thin aluminum-doped zinc-oxide layer 20. The nano-layer including alumina 30 is also referred to herein as the nano-layer 30 or the alumina nano-layer 30.

An ultra-thin layer, as referred to herein, is a layer of less than or equal to 100 nm or a layer less than or equal to 50 nm. Thus, in embodiments of the present invention, the ultra-thin aluminum-doped zinc oxide layer 20 has a thickness less than or equal to 100 nm or a thickness less than or equal to 50 nm. A nano-layer, as referred to herein, is a layer of less than or equal to 5 nm or a layer less than or equal to 3 nm. Thus, in embodiments of the present invention, the alumina nano-layer 30 has a thickness less than or equal to 5 nm or has a thickness less than or equal to 3 nm.

In an embodiment, the electrical contact 40 is a metal, for example a metal wire including silver, aluminum, gold, titanium, or other metals or metal alloys. In another embodiment, the electrical contact 40 is a thin-film conductor.

The present invention provides an unexpected advantage in improved conductivity of the ultra-thin aluminum-doped zinc oxide layer 20 and reduced contact resistance through the alumina nano-layer 30. The alumina nano-layer 30 of the present invention provides environmental robustness to the ultra-thin aluminum-doped zinc oxide layer 20 and very thin layer structures.

Ultra-thin layers of conductive oxides in the prior art have higher intrinsic resistivity than thicker layers. Applicants have recognized that this is, at least in part, a consequence of surface effects. By passivating the ultra-thin aluminum-doped zinc oxide layer 20 of the present invention, the resistivity is unexpectedly reduced by stabilizing or reducing structural and chemical discontinuities at the surface of the ultra-thin aluminum-doped zinc oxide layer 20 between the ultra-thin aluminum-doped zinc oxide layer 20 and the alumina nano-layer 30, or by injection of charge from the alumina nano-layer 30 to the ultra-thin aluminum-doped zinc oxide layer 20. By using a nano-layer of passivating alumina, the resistance between the electrical contacts 40 is unexpectedly reduced. The resistance between the electrical contacts 40 includes both the contact resistance of the alumina nano-layer 30 and the intrinsic resistance ultra-thin aluminum-doped zinc oxide layer 20.

In various embodiments of the present invention, the electrical resistance between the electrical contact 40 and the ultra-thin aluminum-doped zinc oxide layer 20 is less than or equal to 2,000 ohms, less than or equal to 1,000 ohms or less than or equal to 500 ohms. In other embodiment, the sheet resistance of the ultra-thin aluminum-doped zinc oxide layer 20 is less than or equal to 10,000 ohms per square, less than or equal to 5,000 ohms per square, less than or equal to 1,000 ohms per square, less than or equal to 500 ohms per square, or less than or equal to 250 ohms per square.

Reductions in the thickness of the alumina nano-layer 30 will correspondingly reduce the contact resistance of the electrical contact 40 to the ultra-thin aluminum-doped zinc oxide layer 20. Similarly, increases in the thickness of the ultra-thin aluminum-doped zinc oxide layer 20 will reduce the sheet resistance of the ultra-thin aluminum-doped zinc oxide layer 20. However, the reduction in sheet resistance at ultra-thin thicknesses of the ultra-thin aluminum-doped zinc oxide layer 20 when the ultra-thin aluminum-doped zinc oxide layer 20 is passivated with the alumina nano-layer 30 is greater than expected. Moreover, the reduction in contact resistance through the alumina is greater than expected when the alumina is an alumina nano-layer 30.

In embodiments of the present invention, the ratio of aluminum to zinc in the ultra-thin aluminum-doped zinc-oxide layer 20 is greater than zero and less than or equal to 15%, greater than zero and less than or equal to 8%, greater than zero and less than or equal to 5%, or greater than zero and less than or equal to 2%. In other embodiments, the ultra-thin aluminum-doped zinc-oxide layer 20 is a super-lattice. A super lattice (subsets of which are modulation-doped structures) has alternating semiconductor layers that contain different types or concentrations of electrical dopants. In embodiments of this type, local concentrations of an aluminum dopant, on an atomic layer scale, are as high as 100% but the average concentration over the entire ultra-thin aluminum-doped zinc-oxide layer 20 is less than or equal to 15%, 8%, 5%, or 2% aluminum content.

In another embodiment of the present invention, the electrical conductor 5 further includes a plurality of electrical contacts 40 in electrical communication with the ultra-thin aluminum-doped zinc-oxide layer 20 through the alumina nano-layer 30. Such structures enable electrical connection to a variety of thin-film passive electrical devices, including simple conductors, electrodes, resistors, and capacitors and a variety of thin-film active devices, including transistors.

Figure 3:
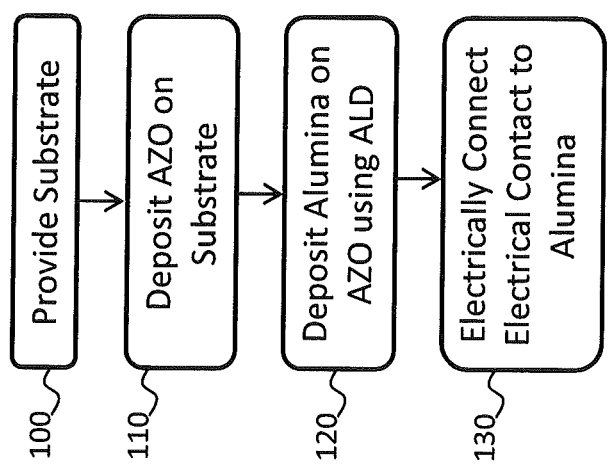
FIG. 3 is a flow diagram illustrating a method making the structure of FIG. 1 according to an embodiment of the present invention.

Referring to FIG. 3, in a method of the present invention, an electrical conductor 5 of the present invention is made by providing a substrate 10 in step 100 and coating the substrate 10 with an ultra-thin aluminum-doped zinc oxide layer 20 in step 110. The ultra-thin aluminum-doped zinc oxide layer 20 is deposited using ALD. In step 120, an alumina nano-layer 30 is deposited on the ultra-thin aluminum-doped zinc oxide layer 20 using ALD and an electrical contact 40 is electrically connected to the alumina nano-layer 30 in step 130. The electrical contact 40 is connected to electrical circuits to provide an electrical current to the electrical conductor 5.

Substrates 10 are known in the art and can include glass, plastic, metal or other materials. Substrates 10 can include other layers on which the ultra-thin aluminum-doped zinc oxide layer 20 is deposited. According to various embodiments of the present invention, the substrate 10 is any material having a surface on which a layer is deposited. The substrate 10 is a rigid or a flexible substrate made of, for example, a glass, metal, plastic, or polymer material, is transparent, and can have opposing substantially parallel and extensive surfaces. Substrates 10 can include a dielectric material useful for capacitive touch screens and can have a wide variety of thicknesses, for example, 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

Atomic layer deposition (ALD) is known in the art. ALD is a variant of chemical vapor deposition (CVD) in which a substrate is exposed to an alternating sequence of reactant gases. Since its inception, as described in "Method for producing compound thin films," in U.S. Pat. No. 4,058,430, Nov. 15, 1977, by T. Suntola and J. Antson, the technique has been shown to produce high-quality films in applications such as diffusion-barriers layers and dielectric films. Diffusion-barrier layers formed by ALD are described in "Ca test of $Al_2O_3$ gas diffusion barriers grown by atomic layer deposition on polymers," in *Appl. Phys. Lett.*, vol. 89, p. 031915, 2006, by P. F. Carcia, R. S. McLean, M. H. Reilly, M. D. Groner, S. M. George and in "Electrical characterization of thin $Al_2O_3$ films grown by atomic layer deposition on silicon and various metal substrates," in *Thin Solid Films*, vol. 413, nos. 1-2, p. 186, 2002, by M. D. Groner, J. W. Elam, F. H. Fabreguette, S. M. George. Dielectric films formed by ALD are described in "Structure and stability of ultrathin zirconium oxide layers on Si(001)," in *Appl. Phys. Lett.*, vol. 76, no. 4, p. 436, 2000 by M. Copel, M. Gribelyuk, and E. Gusev. In another embodiment, spatial ALD processes are used to deposit the alumina nano-layer 30 and the ultra-thin aluminum-doped zinc oxide layer 20 where each of the reactive gases are confined to particular spatial regions of a floating-head apparatus as described in "Deposition system for thin film formation," U.S. Pat. 8,398,770, Mar. 19, 2013 by Dave H Levy, et al that enables relative movement of a substrate to accomplish the alternate exposures of the ALD cycle.

The alumina nano-layer 30 or the ultra-thin aluminum-doped zinc oxide layer 20 can be patterned over the substrate 10.

Inventive And Comparative Examples

Referring back to FIG. 1, examples illustrating the usefulness of the present invention were prepared as follows. Ultra-thin aluminum-doped zinc oxide layers 20 were deposited on borosilicate glass substrates 10 by spatial atomic layer deposition (SALD) using a floating-head apparatus. Ultra-thin aluminum-doped zinc oxide layer 20 films were prepared with and without alumina passivation at 250° C. In each case, an ultra-thin layer of uniformly doped AZO was deposited using a mixture of metal precursors having flow rates of 15 sccm dimethyisopropoxide (DMAI) with 30 sccm diethylzinc (DEZ), and 22.5 sccm in the $H_2O$ channel. After 194 ALD cycles the resulting layer thickness was 31 nm. Thickness calibration was achieved by ellipsometry for representative films grown on the native oxide of silicon wafers under the same process conditions used for glass substrates. As a comparative example of the prior art, one comparative sample was removed from the SALD apparatus without applying a passivating alumina nano-layer 30.

For the passivated samples, alumina nano-layers 30 were then deposited without exposing the ultra-thin aluminum-doped zinc oxide layer 20 to room air. Alumina layers were deposited at 250° C. with 30 sccm of trimethylaluminum, TMA and 22.5 sccm $H_2O$ for metal and oxygen precursors, respectively, on each inventive sample. In the passivated samples, the number of TMA cycles was varied from 4 to 64. The corresponding $Al_2O_3$ (Alumina) thickness ranged from 0.3 nm to 20.5 nm, respectively.

Figure 2:
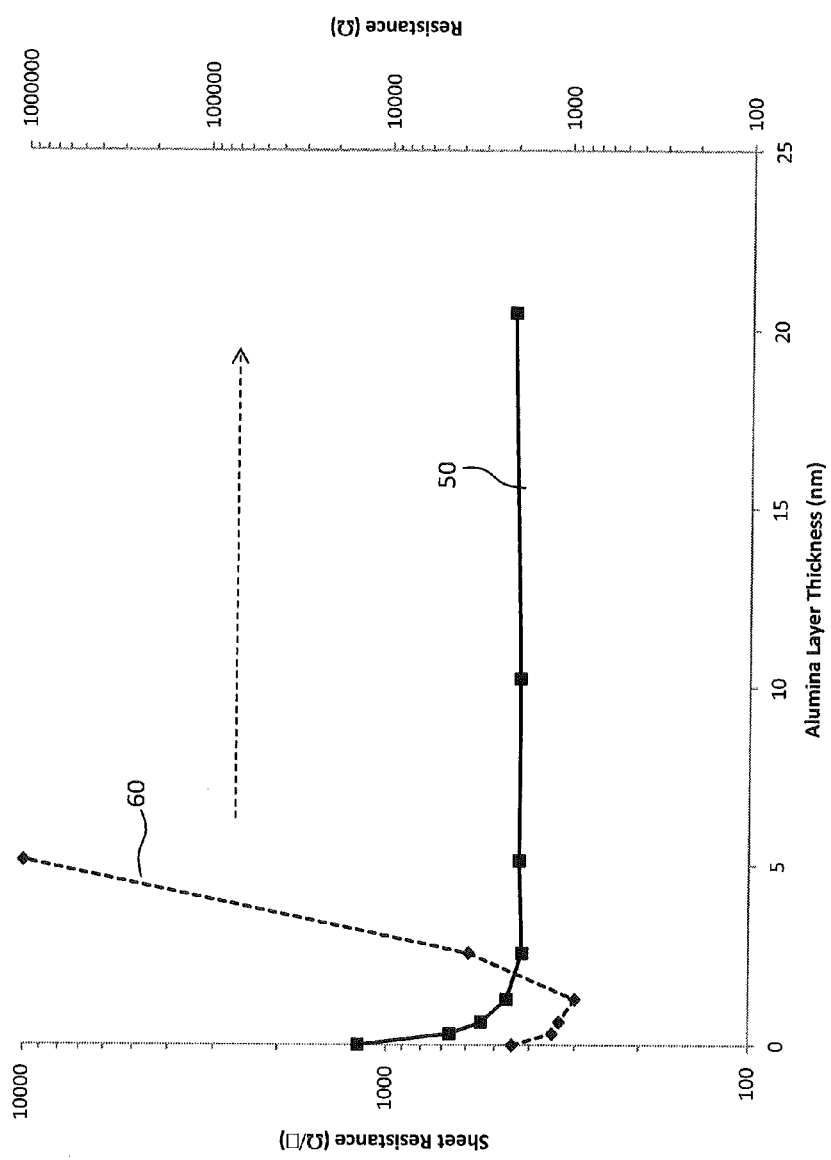
FIG. 2 is a graph illustrating attributes of an embodiment of the present invention corresponding to FIG. 1.

The sheet resistances of ultra-thin aluminum-doped zinc oxide layers 20 on glass having a fixed thickness of 31 nm and a series of alumina thicknesses were measured using a Signotone four-point-probe with auto-ranging. Resistance measurements were made with a Fluke 179 ohmmeter having two-point probes, 1 cm apart. The data are shown in FIG. 2 and Table 1. The resistance was measured through the two electrical contacts 40 electrically connected to the alumina nano-layer 30 and includes the resistance of the ultra-thin aluminum-doped zinc oxide layer 20 and the contact resistance of the two electrical contacts 40. The values in Table 1 are graphed in FIG. 2 and illustrate the resistance 60 and sheet resistance 50.

TABLE 1

Sheet resistance and two-point resistance vs. alumina layer thickness

| $Al_2O_3$ Thickness (nm) | Sheet Resistance (Ohms/□) | Resistance (Ohms) |
|---|---|---|
| 0.0 | 1198 | 2000 |
| 0.3 | 666 | 1200 |
| 0.6 | 544 | 1100 |
| 1.3 | 463 | 900 |
| 2.6 | 421 | 3500 |
| 5.1 | 430 | 1000000 |
| 10.2 | 430 | |
| 20.5 | 452 | |

The results clearly illustrate a decrease in aluminum-doped zinc oxide sheet resistance with increasing alumina layer thickness up to about 2.6 nm. Thicker alumina layers had little or no effect on the aluminum-doped zinc oxide sheet resistance, or corresponding conductivity, of the underlying ultra-thin aluminum-doped zinc oxide layer 20. The two-point-probe resistance data showed an initial decrease due to the improved conductivity of the underlying ultra-thin aluminum-doped zinc oxide layer 20 and relatively low contact resistance. Above about 1.3 nm the resistance grew rapidly with thickness due to contact resistance from the insulating properties of the overlying alumina layer. Thus, the electrical conductivity and contact resistance of ultra-thin aluminum-doped zinc oxide layers 20 greatly and unexpectedly benefit from adding an insulating alumina nano-layer 30 provided the alumina nano-layer 30 is less than about 5 nm or 3 nm thick. Testing sheet resistance before and after exposure to temperatures up to 300° C. in room air showed a marked improvement in stability even when the alumina nano-layer 30 was as thin as 0.3 nm.

In separate examples, a DMAI precursor was used to form the alumina nano-layer 30. Similar results to those obtained using TMA precursor were observed although more cycles were needed to achieve a corresponding layer thickness and concomitant sheet resistance reduction.

In yet other example, similar sheet resistance improvement was observed for the alumina nano-layer 30 deposited on a modulation-doped ultra-thin aluminum-doped zinc oxide layer 20. A 52 nm layer of AZO was deposited at 250° C. by alternating 20 cycles of 60 sccm DEZ metal precursor and 45 sccm $H_2O$ with 2 cycles of a mixture of 51 sccm DMAI and 1 sccm of DEZ metal precursors with 22.5 sccm $H_2O$ for a total of 330 ALD cycles. A 5 nm thick alumina nano-layer 30 was deposited at 250° C. with 16 ALD cycles of 30 sccm of TMA and 22.5 sccm $H_2O$ without exposing the modulation-doped AZO to room air. A comparative example also was prepared as above but without the alumina nano-layer 30. Sheet resistance was 34% lower for the inventive example compared to a modulation-doped AZO layer without the alumina nano-layer 30.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST 5 electrical conductor
10 substrate
20 ultra-thin aluminum-doped zinc oxide layer
30 alumina nano-layer
40 electrical contact
50 AZO sheet resistance
60 resistance
100 provide substrate step
110 deposit AZO on substrate step
120 deposit alumina on AZO using ALD step
130 electrically connect electrical contact to alumina step

The invention claimed is:

1. A method of forming an electrical conductor, comprising:
   depositing an ultra-thin layer having a thickness less than or equal to 100 nm including aluminum-doped zinc oxide layer on a surface;
   using atomic layer deposition to deposit a nano-layer including alumina in contact and conformal with a surface of the ultra-thin layer including aluminum-doped zinc oxide; and
   locating an electrical contact in electrical communication with the ultra-thin layer including aluminum-doped zinc-oxide through the nano-layer including alumina.

2. The method of claim 1, further including depositing the ultra-thin layer including aluminum-doped zinc oxide layer by atomic layer deposition.

3. The method of claim 1, further including depositing the nano-layer including alumina using spatial atomic layer deposition.

4. The method of claim 1, further including depositing the ultra-thin layer including aluminum-doped zinc oxide using spatial atomic layer deposition.

5. The method of claim 1, wherein the ultra-thin layer including aluminum-doped zinc oxide has a thickness less than or equal to 100 nm.

6. The method of claim 1, wherein the nano-layer including alumina has a thickness less than or equal to 5 nm.

7. The method of claim 1, wherein the electrical resistance between the electrical contact and the ultra-thin layer including aluminum-doped zinc-oxide is less than or equal to 2,000 ohms.

8. The method of claim 1, wherein the electrical resistance between the electrical contact and the ultra-thin layer including aluminum-doped zinc-oxide is less than or equal to 1,000 ohms.

9. The method of claim 1, wherein the electrical resistance between the electrical contact and the ultra-thin layer including aluminum-doped zinc-oxide is less than or equal to 500 ohms.

10. The method of claim 1, wherein the sheet resistance of the ultra-thin layer including aluminum-doped zinc-oxide is less than or equal to 10,000 ohms per square.

11. The method of claim 1, wherein the sheet resistance of the ultra-thin layer including aluminum-doped zinc-oxide is less than or equal to 5,000 ohms per square.

12. The method of claim 1, wherein the sheet resistance of the ultra-thin layer including aluminum-doped zinc-oxide is less than or equal to 500 ohms per square.

13. The method of claim 1, wherein the sheet resistance of the ultra-thin layer including aluminum-doped zinc-oxide is less than or equal to 250 ohms per square.

14. The method of claim 1, wherein the ratio of aluminum to zinc in the ultra-thin layer including aluminum-doped zinc-oxide is greater than zero and less than or equal to 15%.

15. The method of claim 1, wherein the ultra-thin layer including aluminum-doped zinc-oxide is a super-lattice having less than 15% aluminum content.

16. A method of forming an electrical conductor, comprising:
   depositing an ultra-thin layer having a thickness less than or equal to 100 nm including aluminum-doped zinc oxide layer on a surface;
   using atomic layer deposition to deposit a nano-layer including alumina in contact and conformal with a surface of the ultra-thin layer including aluminum-doped zinc oxide; and
   locating a plurality of electrical contacts in electrical communication with the ultra-thin layer including aluminum-doped zinc-oxide through the nano-layer including alumina.

* * * * *